United States Patent [19]

Tanaka

[11] 4,327,445
[45] Apr. 27, 1982

[54] FREQUENCY CONVERTER

[75] Inventor: Masafumi Tanaka, Koganei, Japan

[73] Assignee: Hitachi Denshi Kabushiki Kaisha, Tokyo, Japan

[21] Appl. No.: 56,472

[22] Filed: Jul. 11, 1979

[30] Foreign Application Priority Data

Jul. 14, 1978 [JP] Japan .................................. 53-85087

[51] Int. Cl.³ .......................... H04B 1/04; H04B 1/28
[52] U.S. Cl. .................................. 455/118; 455/319;
455/321; 455/323; 455/333
[58] Field of Search ............... 455/118, 190, 313, 318,
455/319, 321, 322, 323, 324, 333, 20, 22, 84, 86;
363/158, 159

[56] References Cited

U.S. PATENT DOCUMENTS

| | | | |
|---|---|---|---|
| 2,978,579 | 4/1961 | Sosin | 455/313 |
| 3,624,506 | 11/1971 | Townsend | 455/333 |
| 3,890,573 | 6/1975 | Strenglein | 455/319 |
| 4,112,373 | 9/1978 | Miyamoto et al. | 455/321 |

Primary Examiner—Jin F. Ng
Attorney, Agent, or Firm—Townsend & Townsend

[57] ABSTRACT

A frequency converter comprises a frequency converting circuit, and filters which are input and output functional with respect to the frequency converting circuit for passing input and output frequency waves respectively and which have different passing frequency bands. A single terminal is provided for the frequency converter, through which reception of the input frequency wave to the input functional filter and delivery of the output frequency wave from the output functional filter are effected.

4 Claims, 8 Drawing Figures

PRIOR ART

FREQUENCY CONVERTER

BACKGROUND OF THE INVENTION

The present invention concerns an improvement in a frequency converter wherein the number of input/output terminals of the frequency converter can be decreased.

In prior art frequency converters, an intermediate frequency input terminal, a signal output terminal, and a local signal input terminal are provided separately so that when a number of converters are desired to be switched over, external wiring becomes extremely complicated, making it very difficult to make an arrangement incorporating the frequency converters small and compact.

A conventional type frequency converter, for instance, an up-converter as shown in FIG. 1 which uses a field effect transistor or FET 4 as a frequency converting element has a separate intermediate frequency input terminal 1 (hereinafter referred to as IF input terminal), local signal input terminal 2 and signal output terminal 3. An intermediate frequency applied to the IF input terminal 1 is sent to the source (or drain) of FET 4 via a low-pass filter (hereinafter referred to as LPF) 5 which passes the intermediate frequency but does not pass the local signal and signal output. This intermediate frequency and the frequency of a local signal supplied to the gate of FET 4 are mixed to give a signal output of a desired frequency to the source (or drain) of FET 4. This signal output is taken out of the signal output terminal 3 via a band pass filter (hereinafter referred to as BPF) 6 which passes the signal output frequency but does not pass the intermediate frequency and local signals. In this manner, the up-converter of FIG. 1 mixes the IF signal and the local signal by utilizing the nonlinear characteristics of FET 4, and delivers out a desired side band at the signal output terminal 3 through BPF 6.

Another conventional up-converter shown in FIG. 2 provides as FET 4 with a feedback circuit 7 to constitute an oscillator which oscillates at a local frequency, thereby eliminating the local signal input terminal. The up-converter of FIG. 2 operates similarly to that shown in FIG. 1.

These up-converters require two or three input/output terminals. For instance, if several up-converters shown in FIG. 2 are to be used by switching them over, numerous external wiring conductors are necessary as shown in FIG. 3 and the wiring becomes quite complicated. More particularly, in an arrangement using four up-converters 30-1, 30-2, 30-3 and 30-4, a two-stage, four-contact transfer switch 8 is provided. Each of the stationary contacts on the first stage 8a are connected to IF input terminal 1 of the respective up-converters while the movable contact is connected to a terminal 9 which constantly receives the intermediate frequency. On the other hand, the respective stationary contacts on the second stage 8b are connected to the signal output terminal 3, and the movable contact is connected to a terminal 10 from which the output is fed out. Accordingly, switchover of the transfer switch 8 will activate one of the up-converters 30-1, 30-2, 30-3, and 30-4 to allow taking out a desired signal output from the terminal 10. In this example, 8 external wiring conductors are required between the terminals 1, 3 and the switch 8, and when the number of up-converters is further increased, or when the local signal input terminal 2 is provided as in the case of the up-converter shown in FIG. 1, the external wiring problem is aggravated, becoming bulky and increasingly complicated, thus presenting obstacles in making the arrangement small and compact.

SUMMARY OF THE INVENTION

An object of the present invention is to provide a frequency converter suitable for being ganged for switch over usage.

Another object of the present invention is to provide an arrangement for switching over a plurality of frequency converters which can reduce the space occupied by input/output wiring conductors.

According to the present invention, there is provided a frequency converter comprising a frequency converting circuit, and filters which are input and output functional with respect to the frequency converting circuit for passing input and output frequency waves respectively and which have different passing frequency bands, wherein reception of the input frequency wave to the input functional filter and delivery of the output frequency wave from the output functional filter are effected through a single terminal of the frequency converter.

DESCRIPTION OF THE PREFERRED EMBODIMENTS

Figure 6:
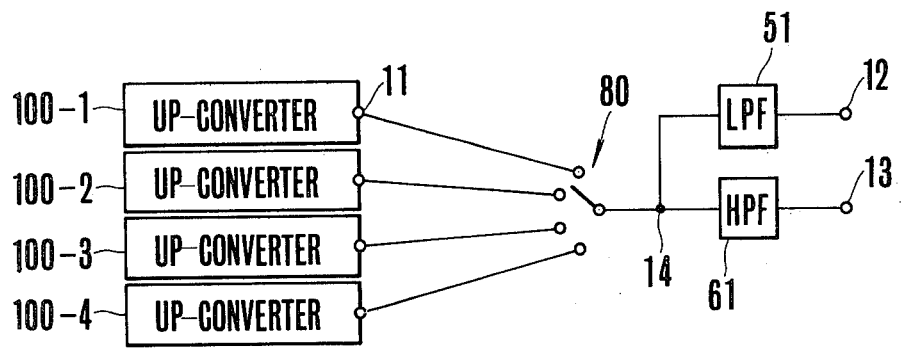
FIG. 6 is a connection diagram for connecting a plurality of frequency converters shown in FIG. 5 in a switchable fashion.

FIG. 6 shows an example of an up-converter wherein the present invention is applied to a frequency converter of the type which is activated upon receipt of a local signal from an external source. The up-converter is provided with a frequency converting circuit including an FET 40 which is a frequency converting element, a local signal input terminal 20 connected to the gate of FET 40, and LPF 50 and BPF 60 connected between the source (or drain) of FET 40 and a single input/output terminal 11. LPF 50, serving as an input functional filter to the frequency converting circuit, has such a filtering characteristic as to pass the intermediate frequency sent from the input/output terminal 11 to the converting circuit but not to pass the local signal and the output signal from the converting circuit, whereas BPF 60, serving as an output functional filter from the frequency converting circuit, has a characteristic of passing the output signal frequency sent from the converting circuit to the input/output terminal 11 but not passing the intermediate frequency and local signals.

In the construction as described above, an intermediate frequency signal (for instance, 130 MHz) is fed to the input/output terminal 11 and applied to FET 40 via lead 50a and LPF 50. FET 40 mixes the local signal supplied to its gate (for instance, 7 GHz) and the IF signal, and a converted signal output of a desired side band (for instance, 7130 MHz) is taken out from the input/output terminal 11 through lead 60a and BPF 60.

Figure 1:
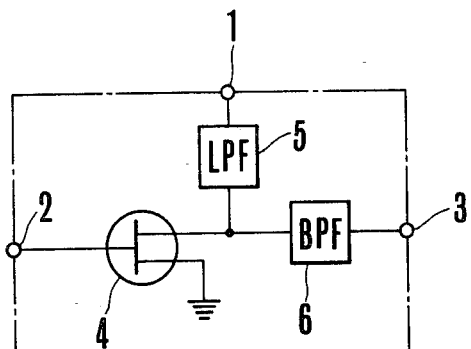
FIG. 1 is a schematic connection diagram of one example of a conventional frequency converter.
Figure 2:
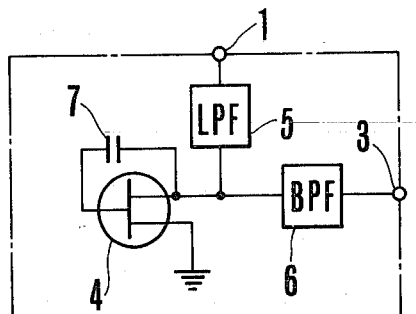
FIG. 2 is a schematic connection diagram of another example of a conventional frequency converter.
Figure 3:
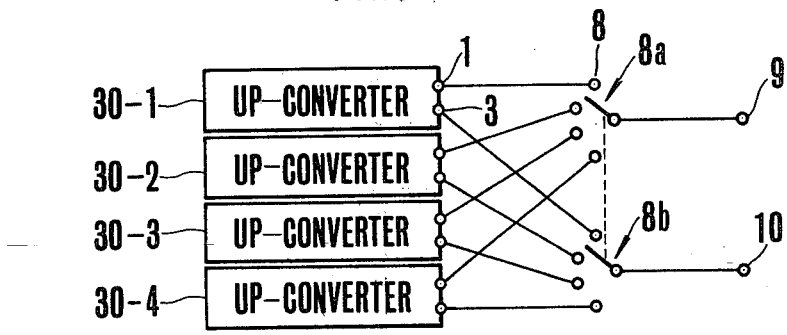
FIG. 3 is a connection diagram for connection a plurality of frequency converters shown in FIG. 2 in a switchable fashion.
Figure 4:
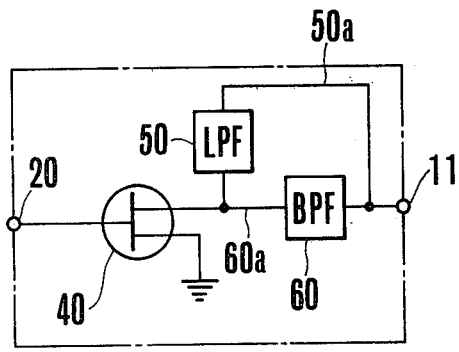
FIG. 4 is a schematic connection diagram of one embodiment of a frequency converter in accordance with the present invention.
Figure 5:
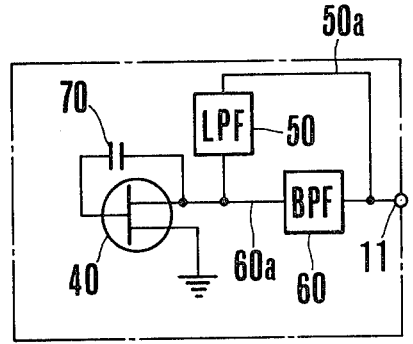
FIG. 5 is a schematic connection diagram of another embodiment of a frequency converter in accordance with the present invention.

FIG. 5 shows another embodiment wherein the present invention is applied to a self-excited frequency converter, and the same numbers in FIG. 5 denote the same parts shown in FIG. 4. In this embodiment, the converting circuit has an additional feedback circuit 70 and oscillates at a local frequency, and therefore the local signal input terminal is not needed.

In FIGS. 4 and 5, it is a design variation obvious to those skilled in the art to disconnect the LPF 50 from the source (or drain) of FET 40 and then connect to the gate of FET 40.

Referring to FIG. 6, there is shown a switching arrangement embodying the present invention wherein a plurality of frequency converters are advantageously connected in a switchable fashion. In particular, the manner of connecting a plurality of self-excited frequency converters of the FIG. 5 type is best shown in FIG. 6.

Each of up-converters 100-1, 100-2, 100-3, and 100-4 is constructed as shown in FIG. 5 and has one input-/output terminal 11. In practice, the constant of the feedback circuit 70 of the respective up-converters is different so that the signal output frequencies of respective up-converters are different, and the different frequency outputs are switched over as desired. The stationary contacts of a one-stage four-contact transfer switch 80 are connected to the input/out terminal 11 of respective up-converters. The common movable contact of the switch 80 is connected to an IF input terminal 12 via a filter 51 having the same characteristics as LPF 50 of FIG. 5, and also to a signal output terminal 13 via a high-pass filter 61. The filter 61 has such a characteristic as to pass different signal output frequencies of respective up-converters 100-1, 100-2, 100-3 and 100-4, but block the intermediate frequency and local signals.

In the construction as above described, when the switch 80 is transferred to, for instance, the up-converter 100-1, the IF signal is supplied to the converting circuit 40, 70 via the terminal 12, the filter 51, the switch 80, and the input/output terminal 11, the lead 50a and filter 50 of the up-converter 100-1. On the other hand, the output signal from the converting circuit 40, 70 is taken out from the terminal 13 via the filter 60, the input/output terminal 11, the switch 80 and the filter 61. The input and the output waves are coexistent at a junction 14 and then separated by the filters 51 and 61. According to the embodiment shown in FIG. 6, addition of the filters 51, 61 will cut down half the number of wiring conductors between the up-converters 100-1, 100-2, 100-3 and 100-4 and the switch 80 as compared with the conventional arrangement, and can diminish the space occupied by the wiring conductors. The switch 80 is a one stage type so that the complex external wiring can also be eliminated and the arrangement can be made quite small and compact.

Figure 7:
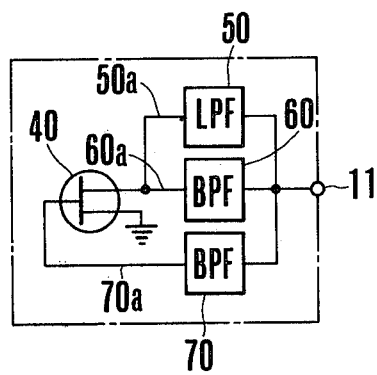
FIG. 7 is a schematic connection diagram of further embodiment of a frequency converter in accordance with the present invention.
Figure 8:
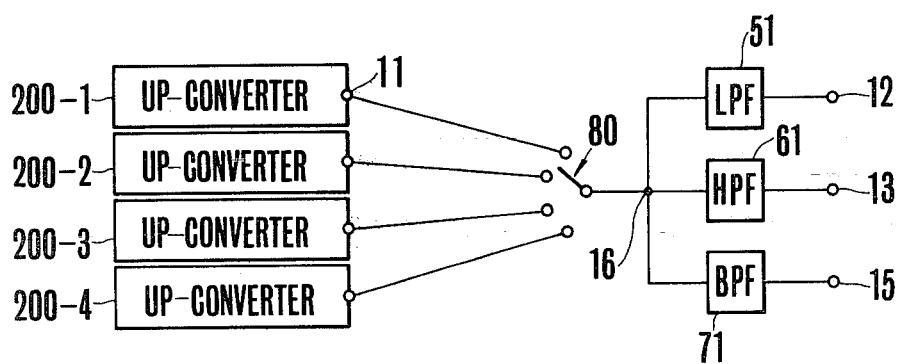
FIG. 8 is a connection diagram for connecting a plurality of frequency converters shown in FIG. 7 in a switchable fashion.

Referring to FIG. 7, the frequency converter of FIG. 4 is modified into an embodiment wherein the gate of FET 40 is also connected to an input/output terminal 11 via lead 70a and BPF 70, whereby all of the input/output signals are passed through the single terminal 11. This modified embodiment is suited for switchover of a number of frequency converters of external local signal type. A switching arrangement shown in FIG. 8 comprises four, only for clarity of illustration, external local signal type up-converters 200-1, 200-2, 200-3 and 200-4, and an additional BPF 71 connected between a junction 16 and a local signal input terminal 15. This switching arrangement operates in a similar manner to FIG. 6 and is not described in detail to avoid prolixity. The number of wiring conductors can be cut down more eminently than in the arrangement of FIG. 4.

In the foregoing embodiments examples of using an up-converter as a frequency converter were explained, but similar constructions may be realized with down-converters. It is also possible to apply the present invention to an up-converter wherein a varactor, an IMPATT diode or the like is used in place of a FET.

What is claimed is:

1. An arrangement for switching over frequency converters comprising:
   a plurality of frequency converters to be switched over, each frequency converter including a frequency converter circuit, input filter means for frequency filtering signals input thereto over a first frequency range, and output filter means coupled to the associated frequency converting circuit for frequency filtering signals generated by said frequency converting circuit over a second frequency range, said first frequency range being different from said second frequency range, and a single terminal coupled to the input of said input filter means for supplying input signals thereto and coupled to the output of said output filter means, whereby input and output signals are supplied to and from said frequency converter via said single terminal;
   switchover means connected to said single terminal of each of said respective frequency converters, said switchover means having a common terminal;
   at least one additional filter means connected between said common terminal and at least one input terminal for receiving input frequency signals and having the same frequency pass range as that of said input filter; and
   second additional filter means connected between said common terminal and an output terminal for manifesting output signals, said second additional filter having a different frequency pass band from said input filter means.

2. In a frequency converter comprising a frequency converting circuit including a self-excited type oscillator; input filter means coupled to said frequency converting circuit for frequency filtering signals input thereto over a first frequency range, said input filter means including a low pass filter for passing an intermediate frequency; output filter means coupled to said frequency converting circuit for frequency filtering signals supplied by said frequency converting circuit over a second frequency range, said output filter means including a band pass filter for passing the signal output of the oscillator, said first frequency range being different from said second frequency range; and a single terminal coupled to the input of said input filter means for supplying input signals thereto and coupled to the output of said output filter means for supplying output signals therefrom.

3. In a frequency converter comprising a frequency converting circuit of the external local signal type and having a local signal input terminal; input filter means coupled to said frequency converting circuit for frequency filtering signals input thereto over a first frequency range, said input filter means including a low pass filter for passing an intermediate frequency; output filter means coupled to said frequency converting circuit for frequency filtering signals supplied by said frequency converting circuit over a second frequency range, said output filter means including a band pass filter for passing the signal output of the frequency converting circuit, said first frequency range being different from said second frequency range; and a single terminal coupled to the input of said input filter means for supplying said input signals thereto and coupled to the output of said output filter means for supplying output signals therefrom.

4. In a frequency converter comprising a frequency converting circuit of an external local signal type; input filter means coupled to said frequency converting circuit for frequency filtering signals input thereto over a first frequency range, said input filter means including a low pass filter for passing an intermediate frequency and a band pass filter for passing a local signal; output filter means coupled to said frequency converting circuit for frequency filtering signals supplied by said frequency converting circuit over a second frequency range, said output filter means including a band pass filter for passing the signal output of the frequency converting circuit, said first frequency range being different from said second frequency range; and a single terminal coupled to the input of said input filter means for supplying said input signals thereto and coupled to the output of said output filter means for supplying output signals therefrom.

* * * * *